US006980046B2

(12) United States Patent
Soe

(10) Patent No.: US 6,980,046 B2
(45) Date of Patent: Dec. 27, 2005

(54) CHARGE PUMP CIRCUIT USING ACTIVE FEEDBACK CONTROLLED CURRENT SOURCES

(75) Inventor: Zaw Min Soe, Encinitas, CA (US)

(73) Assignee: Wionics Research, Irvine, CA (US)

( * ) Notice: Subject to any disclaimer, the term of this patent is extended or adjusted under 35 U.S.C. 154(b) by 0 days.

(21) Appl. No.: 10/794,189

(22) Filed: Mar. 5, 2004

(65) Prior Publication Data

US 2005/0195003 A1 Sep. 8, 2005

(51) Int. Cl.[7] .................................................. G05F 1/10
(52) U.S. Cl. ...................... 327/536; 327/537; 327/538; 327/540; 327/157; 363/59; 363/60
(58) Field of Search ................................ 327/536, 537, 327/538, 540, 589, 590, 148, 157; 307/110; 363/59, 60

(56) References Cited

U.S. PATENT DOCUMENTS 6,107,889 A * 8/2000 Strange et al. ................ 331/17
6,329,872 B1 * 12/2001 Foroudi ...................... 327/541
6,396,334 B1 * 5/2002 Aram ......................... 327/541
6,566,923 B1 * 5/2003 Pettersen .................... 327/157
6,608,511 B1 * 8/2003 Hsu .......................... 327/157
6,611,161 B1 * 8/2003 Kumar et al. ............... 327/157
6,664,829 B1 * 12/2003 Hughes ...................... 327/157
6,768,359 B2 * 7/2004 Hsu .......................... 327/157
6,781,425 B2 * 8/2004 Si ............................. 327/148

* cited by examiner

*Primary Examiner*—Timothy P. Callahan
*Assistant Examiner*—An T. Luu
(74) *Attorney, Agent, or Firm*—Foley & Lardner LLP

(57) ABSTRACT

A charge pump circuit utilizes active feedback control circuits to control the currents produced by sinking and sourcing current sources. The feedback control circuits may regulate the drain voltages of sinking and sourcing current source transistors to make them approximately equal to respective reference voltages received by the feedback control circuits. The charge pump circuit may utilize multiple supply voltages, with a higher supply voltage such as a 3.3 V supply voltage being used to drive current source transistors, and a lower supply voltage such as a 1.8 V supply voltage being used to drive switches in a switching section.

23 Claims, 5 Drawing Sheets

CHARGE PUMP CIRCUIT USING ACTIVE FEEDBACK CONTROLLED CURRENT SOURCES

BACKGROUND OF THE INVENTION

1. Field of the Invention

Embodiments of the invention pertain to charge pump circuits and to circuits and devices incorporating charge pump circuits.

2. Related Technology

Wireless communication devices typically require a frequency synthesis element to produce frequencies for modulating transmitted signals and demodulating received signals. Frequency synthesis is typically provided using a phase locked loop circuit. FIG. 1*a* shows an example of a conventional $3^{rd}$ order phase locked loop, and FIG. 1*b* show an example of a conventional $>3^{rd}$ order phase locked loop. The phase locked loop is a feedback circuit comprised of a phase frequency detector 10, a charge pump 12, a low pass filter 14, a voltage controlled oscillator 16, and a frequency divider 18. The phase frequency detector 10 receives as inputs a reference frequency $F_{ref}$ and an output frequency $F_{out}$ produced by the voltage controlled oscillator 16. The phase frequency detector 10 compares the phases of the two input signals and generates up and down control signals that are provided to the charge pump 12. The charge pump 12 drives current into or out of the low pass filter 14 in response to the up and down control signals. The output frequency of the voltage controlled oscillator 16 is controlled by the charge stored in the low pass filter 14. The frequency produced by the voltage controlled oscillator 16 is provided as input to the frequency divider 18, which divides the input frequency by an integer n. Consequently, the phase difference detected by the phase frequency detector 10 controls the output frequency $F_{out}$ of the phase locked loop in response to the input frequency $F_{ref}$.

An important requirement for communication devices is phase noise. FIG. 2 shows noise levels in the conventional phase locked loop circuits of FIGS. 1*a* and 1*b*. As seen in FIG. 2, the conventional circuits produce an out-of-band preference spur having a suppression of approximately 50 dB, which is detectable in the output of the circuit. The preference spur presents a problem for modulation circuits that use higher-order modulation schemes, such as QAM modulation circuits using constellations of 64 or 256 symbols. The conventional circuit also produces an in-band normalized phase noise of approximately −200 dBc/Hz.

It has been determined that the charge pump is a significant source of noise in the phase locked loop circuit. FIG. 3 shows a schematic diagram of a conventional charge pump circuit. The charge pump is comprised of current sources 20, 22 that drive current into and out of an output node 36. The current sources are selectively coupled to the output node 36 by switches 28, 30, thereby controlling the charge that is stored in the low pass filter 14.

In the ideal charge pump, the currents of the current sources 20, 22 are identical. Conventional designs attempt to achieve a current source match of less than 0.1% by implementing the current sources as matched MOS transistors that receive the same control voltage at their gates and that are operated in the non-linear range. However, in practice, variations in supply voltage and in the threshold voltages of the matched transistors tend to produce unequal output currents that may vary by 10% or more. Current mismatch has been identified as a major source of preference spurs.

Scaling of components to small critical dimensions produces further problems in conventional charge pump circuits. The use of 0.18 micron technology in charge pump circuits limits the supply voltage to approximately 1.8 V, and as shown in FIG. 4, the current sources begin to operate in the linear range when the voltage driving the current source falls below approximately 400 mV. This creates additional current mismatch when the voltage at the output node falls below 400 mV, causing further degradation. A conventional solution to this problem is to implement the current sources as transistors having a large ratio of channel width to channel length. However, the use of higher transconductance components introduces more current source noise into the phase locked loop at every phase comparison instant. This degrades of the spectral purity of the phase locked loop. In systems using high-order phase modulation such as wireless LANs, this design may not meet the stringent requirements for low in-band phase noise.

Consequently, conventional charge pump circuit designs have several shortcomings that limit phase locked loop performance, including the production of preference spurs and poor operation at small critical dimensions.

SUMMARY OF THE INVENTION

In accordance with preferred embodiments of the invention, the current sources of a charge pump circuit are regulated by active feedback control to match the currents that are driven into and out of the charge pump output node. Active feedback control may be implemented using voltage regulation devices that control the drain voltages of current source transistors so that the currents produced by the current source transistors mirror a reference current. This significantly reduces the preference spur exhibited by prior art designs.

Charge pump circuits in accordance with preferred embodiments of the invention also utilize multiple supply voltages. The current source transistors may be operated in the linear range, and a higher supply voltage such as a 3.3 V supply voltage may be used to drive the current source transistors, thus providing a high overdrive gate voltage that reduces the noise contribution to the PLL loop. A lower supply voltage such as a 1.8 V supply voltage may be used to drive the switches, which enables the switches to be implemented using very small critical dimension devices that provide fast switching speeds.

In accordance with one preferred embodiment, a charge pump circuit utilizes MOSFET transistors as current sources. The current sources mirror a reference current that is driven through a reference transistor. A reference voltage produced at the drain of the reference transistor is provided to the positive input of a differential amplifier that controls the gate voltage of a voltage regulation transistor coupled in series with the sinking current source transistor that drives current out of the output node. The drain voltage of the sinking current source transistor is provided as a negative input to the differential amplifier, forming an active feedback control circuit in which the differential amplifier sets the drain voltage of the sinking current source transistor through feedback control of the gate voltage supplied to the voltage regulation device, which causes the current produced by the sinking current source to be approximately equal in magnitude to the reference current. A second reference voltage is provided to the positive input of a differential amplifier that controls the gate voltage of a voltage regulation transistor coupled in series with the sourcing current source transistor that drives current into the output node. The drain voltage of the sourcing current source transistor is provided as a negative input to the differential amplifier, forming an active feedback control circuit that controls the drain voltage of the sourcing current source transistor so that the current produced by the sourcing current source is approximately equal in magnitude to the reference current. Therefore the two current sources drive the output node with currents having essentially identical magnitudes.

DETAILED DESCRIPTION

Figure 1A:
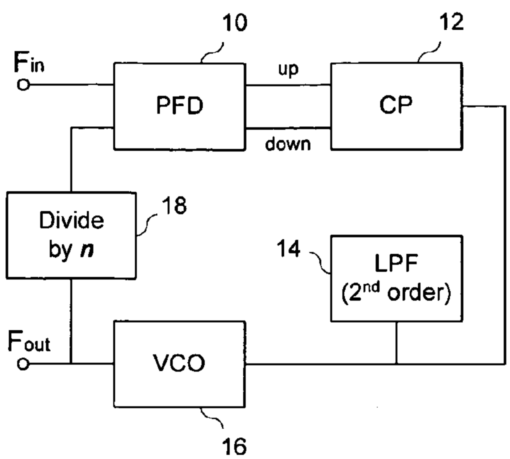
FIGS. 1*a* and 1*b* show conventional phase locked loop circuits.
Figure 1B:
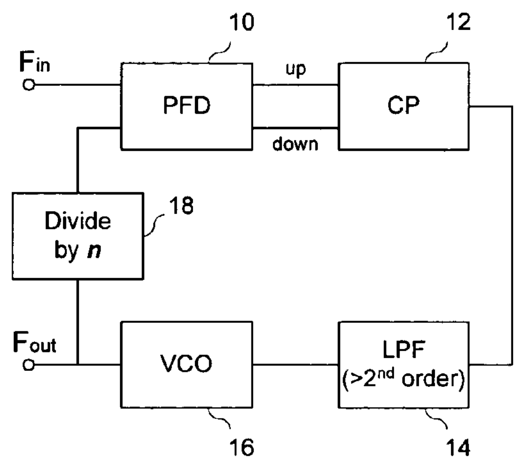
Figure 2:
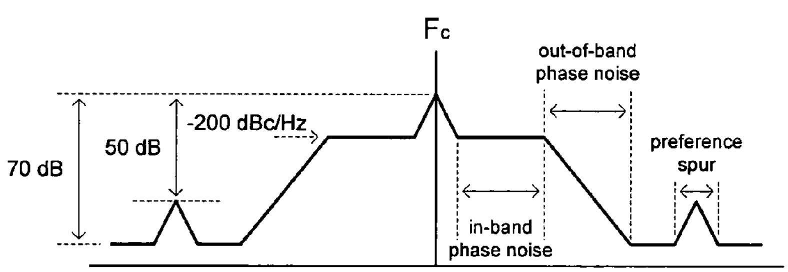
FIG. 2 shows a frequency spectrum and noise levels of the conventional phase locked loop circuits.
Figure 3:
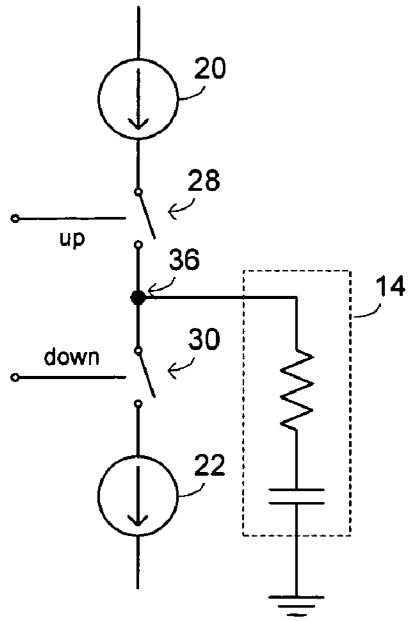
FIG. 3 shows a conventional charge pump circuit.
Figure 4:
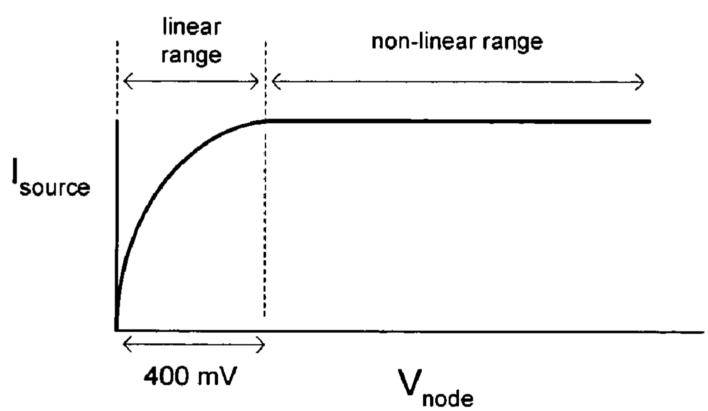
FIG. 4 shows the current produced by a current source in the circuit of FIG. 3 as a function of the voltage driving the current source.
Figure 5:
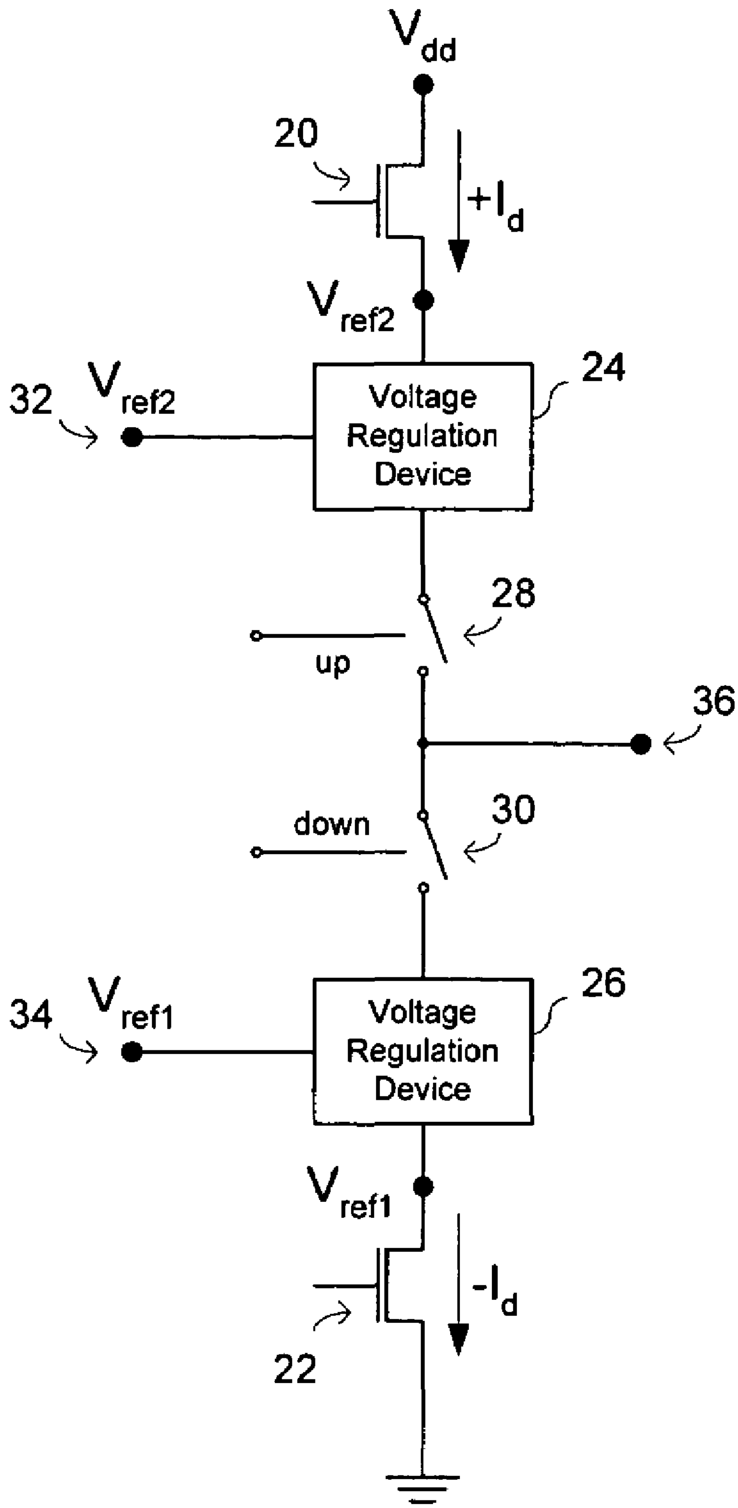
FIG. 5 shows a generalized schematic diagram of a charge pump circuit in accordance with a preferred embodiment of the invention.

In accordance with preferred embodiments of the invention, a charge pump circuit uses active feedback control of current mirrors to provide matched current sources. The active feedback control is preferably implemented using voltage regulation devices that control the voltages that drive charge into and out of the charge pump output node. FIG. 5 shows a generalized schematic diagram of a charge pump circuit in accordance with preferred embodiments of the invention. The charge pump circuit utilizes MOSFETs as current source transistors 20, 22. Voltage regulation devices 24, 26 are placed in series with the current source transistors 20, 22 between the current source transistors 20, 22 and the switches 28, 30. The voltage regulation devices 24, 26 receive respective reference voltages $V_{ref1}$, $V_{ref2}$ at their inputs 32, 34 and control the drain voltages of the current source transistors 20, 22 so that the drain voltages are the same as the reference voltages. The values of the reference voltages $V_{ref1}$, $V_{ref2}$ are selected such that the current sources 20, 22 produce currents $I_d$ and $-I_d$ having approximately the same magnitude and opposite polarity with respect to the output node 36.

Figure 6:
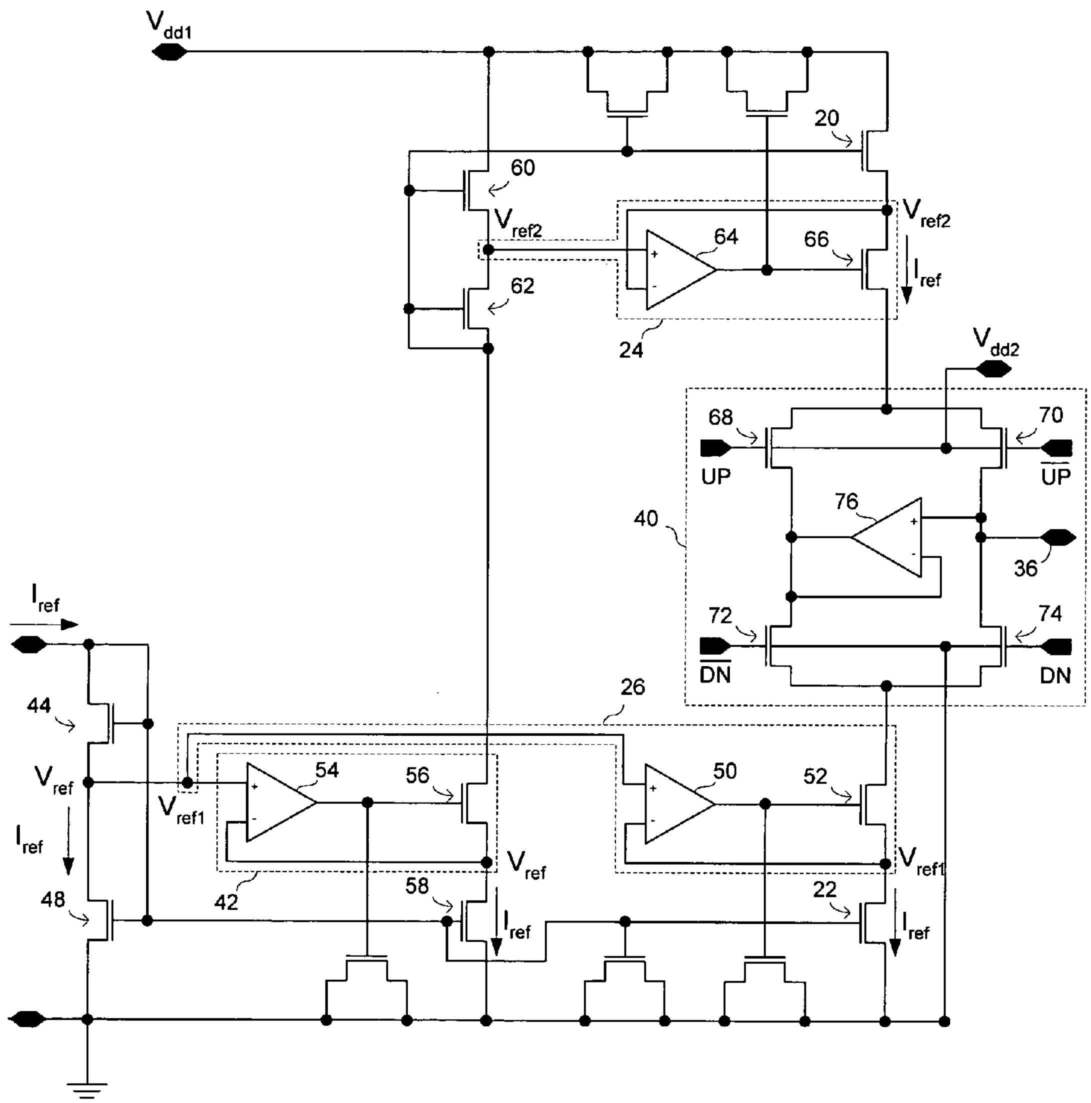
FIG. 6 shows a component level schematic diagram of a charge pump circuit in accordance with a preferred embodiment of the invention.

FIG. 6 shows a component level schematic diagram of a charge pump circuit in accordance with a preferred embodiment of the invention. The charge pump circuit utilizes current source transistors 20, 22 to drive charge into and out of an output node 36 through switches provided in a switching section 40. The current sources are implemented as current mirrors referenced to a reference current $I_{ref}$ that is driven through a reference transistor 48. Active feedback control of the current source drain voltages is provided by voltage regulation devices 24, 26.

The lower current source 22, or sinking current source, is controlled by the-voltage regulation device 26. The reference current $I_{ref}$ driven through the reference transistor 48 generates a reference voltage $V_{ref}$ at the drain of the reference transistor 48 having the same value as the drain voltage that is desired at the sinking current source transistor 22. The reference voltage $V_{ref}$ is supplied as a first reference voltage $V_{ref1}$ to the positive input of a differential amplifier 50 of the voltage regulation device 26. The drain voltage of the sinking current source transistor 22 is provided to the negative input of the differential amplifier 50, and the output of the differential amplifier is supplied to the gate of a voltage control transistor 52 that is coupled in series between the switching section 40 and the current source transistor 22. Consequently the differential amplifier 50 and voltage control transistor 52 form a voltage regulation device that uses active feedback control to regulate the drain voltage of the sinking current source transistor 22. The output of the differential amplifier 50 reaches a steady state when the drain voltage of the sinking current source 22 is the same as the reference voltage $V_{ref1}$. Consequently the current driven out of the output node by the sinking current source transistor 22 has approximately the same magnitude as the reference current $I_{ref}$. The current source transistor 22 also exhibits high impedance from the perspective of the output node 36 of the charge pump circuit.

The reference voltage $V_{ref}$ is also supplied to a voltage regulation device 42 that reproduces the reference voltage $V_{ref}$ and reference current $I_{ref}$ at the drain of a current mirror transistor 58 through active feedback control provided by a differential amplifier 54 and a voltage regulation transistor 56. The current $I_{ref}$ produced by the current mirror transistor 58 is driven through voltage divider transistors 60 and 62, producing a second reference voltage $V_{ref2}$ at the node between the transistors 60, 62. The second reference voltage $V_{ref2}$ is provided as a reference voltage to a voltage regulation device 24 that controls the upper current source 20 or sourcing current source. The reference voltage $V_{ref2}$ is supplied to the positive input of a differential amplifier 64 of the voltage regulation device 24. The drain voltage of the sourcing current source transistor 20 is provided to the negative input of the differential amplifier 64, and the output of the differential amplifier 64 is supplied to the gate of a voltage control transistor 66 that is coupled in series between the switching section 40 and the sourcing current source transistor 20. Consequently, the differential amplifier 64 and voltage control transistor 66 comprise a voltage regulation device that uses active feedback control to regulate the drain voltage of the sourcing current source transistor 20. The output of the differential amplifier 64 reaches a steady state when the drain voltage of the sourcing current source 20 is the same as the reference voltage $V_{ref2}$. The parameters of the voltage divider transistors 60, 62 are selected such that a current of approximately the same magnitude as the reference current $I_{ref}$ is produced when the reference voltage $V_{ref2}$ is applied at the drain of the sourcing current source transistor 20. Consequently the current driven into the output node by the sourcing current source transistor 20 is approximately the same as the current driven out of the output node by the sinking current source transistor 22. The sourcing current source transistor 20 also exhibits high impedance from the perspective of the output node 36 of the charge pump circuit.

The current source transistors 20, 22 and the components of the voltage regulation devices 24, 26, 42 are driven by a first voltage source $V_{dd1}$ which is preferably 3.3 V. The current source transistors 20, 22 are operated in the linear region, which minimizes their noise contribution. To provide optimal performance, it is preferable to implement the current handling transistors of the circuit as matched transistors. In particular, transistors 58, 22, 62 and 66 may be matched, and transistors 56, 52, 60 and 20 may be matched. The characteristics of these transistors may be selected with respect to the characteristics of transistors 44 and 48 so that the currents produced by the sourcing and sinking current source transistors have a desired ratio with respect to the reference current.

The transistors in the switching section 40 are driven by a second voltage source $V_{dd2}$ which is preferably 1.8 V to enable the use of 0.18 micron devices with faster switching speeds. The switching section is comprised of a pair of up transistors 68, 70 of opposite conductivities that receive a differential pair of up signals. The up signals cause the up transistors 68, 70 to become conductive, allowing the sourcing current source transistor 20 to drive current into the output node 36. Similarly, the switching section also includes a pair of down transistors 72, 74 of opposite conductivities that receive a differential pair of down signals. The down signals cause the down transistors 72, 74 to become conductive, allowing the sinking current source transistor 22 to drive current out of the output node 36. A differential amplifier 76 is coupled between the nodes at which the up and down transistors are joined to increase the switching speed of the switching section 40.

The charge pump circuit of FIG. 6 also preferably includes MOS capacitors that are coupled to the gate lines of the current source transistors 20, 22 and voltage regulation transistors 52, 56, 66 to reduce noise on the gate lines and improve the stability of the feedback loops.

Figure 7:
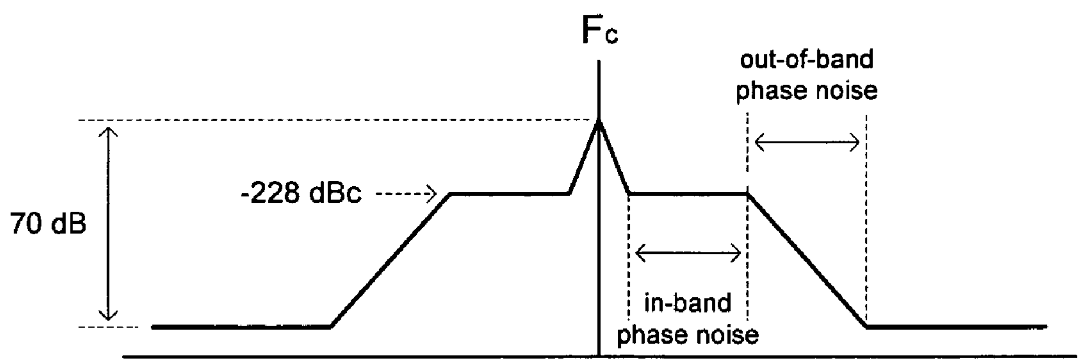
FIG. 7 shows the frequency spectrum and noise levels for a phase locked loop using the charge pump circuit of FIG. 6.

The preferred embodiment shown in FIG. 6 has been simulated and implemented in silicon. The results of simulation and implementation demonstrate that the current sources in this circuit provide nearly identical currents. FIG. 7 shows the noise spectrum of a phase locked loop that incorporates the charge pump circuit of FIG. 6. As seen in this Figure, the matched current sources of the charge pump eliminate the preference spur that is generated in the conventional design. The in-phase noise is also significantly lower than that of the conventional design.

Charge pump circuits in accordance with the preferred embodiment and alternative embodiments may be utilized in a wide variety of devices. Phase locked loop circuits incorporating a charge pump in accordance with embodiments of the invention may exhibit significantly improved noise characteristics compared to conventional devices. Such phase locked loop circuits are advantageously employed for frequency synthesis or other purposes in wireless communication devices, such as wireless LAN (WLAN) transceiver circuits and other wireless communication devices operating at high frequencies or requiring low in-band phase noise.

The circuits, devices, features and processes described herein are not exclusive of other circuits, devices, features and processes, and variations and additions may be implemented in accordance with the particular objectives to be achieved. For example, circuits as described herein may be integrated with other circuits not described herein to provide further combinations of features, to operate concurrently within the same devices, or to serve other types of purposes. Thus, while the embodiments illustrated in the figures and described above are presently preferred for various reasons as described herein, it should be understood that these embodiments are offered by way of example only. The invention is not limited to a particular embodiment, but extends to various modifications, combinations, and permutations that fall within the scope of the claims and their equivalents.

What is claimed is:

1. A charge pump circuit comprising:

a sinking current source for driving current out of an output node of the charge pump circuit;

a sourcing current source for driving current into the output node;

a switching section for selectively connecting the sinking and sourcing current sources to the output node in response to control signals;

a reference transistor receiving a reference current;

a first active feedback control circuit controlling a current produced by the sinking current source to be approximately equal in magnitude to the reference current; and a second active feedback control circuit controlling a current produced by the sourcing current source to be approximately equal in magnitude to the reference current.

2. The charge pump circuit claimed in claim 1, wherein the sinking current source, sourcing current source, and first and second active feedback control circuits are powered by a first voltage source, and the switching section is powered by a second voltage source having a lower voltage than the first voltage source.

3. A charge pump circuit comprising:

a sinking current source comprising a sinking transistor for driving current out of an output node of the charge pump circuit;

a sourcing current source comprising a sourcing transistor for driving current into the output node;

a switching section for selectively connecting the sinking and sourcing current sources to the output node in response to control signals;

a first active feedback control circuit controlling a current produced by the sinking current source comprising a first voltage regulation device for controlling a drain voltage of the sinking transistor; and a second active feedback control circuit controlling a current produced by the sourcing current source comprises a second voltage regulation device for controlling a drain voltage of the sourcing transistor.

4. The charge pump circuit claimed in claim 3, wherein the first voltage regulation device comprises:

a voltage regulation transistor coupled in series between the sinking transistor and the switching section; and a differential amplifier, wherein the differential amplifier receives the drain voltage of the sinking transistor at its negative input, and receives a first reference voltage at its positive input, and supplies its output to the gate of the voltage regulation transistor.

5. The charge pump circuit claimed in claim 4, wherein the first reference voltage received at the positive input of the differential amplifier of the first voltage regulation device is a drain voltage produced in a reference transistor by a reference current driven through the reference transistor.

6. The charge pump circuit claimed in claim 3, wherein the second voltage regulation device comprises:

a voltage regulation transistor coupled in series between the sourcing transistor and the switching section; and a differential amplifier, wherein the differential amplifier receives the drain voltage of the sourcing transistor at its negative input, and receives a second reference voltage at its positive input, and supplies its output to the gate of the voltage regulation transistor.

7. The charge pump circuit claimed in claim 6, wherein the second reference voltage received at the positive input of the differential amplifier of the second voltage regulation device is produced by a voltage divider.

8. The charge pump circuit claimed in claim 6, further comprising:

a current mirror transistor;

a third active feedback control circuit controlling a current in the current mirror circuit to be approximately equal in magnitude to a reference current driven through a reference transistor of the charge pump circuit; and a pair of voltage divider transistors coupled in series between the current mirror transistor and a voltage source, wherein the second reference voltage is generated at a node between the voltage divider transistors.

9. The charge pump circuit claimed in claim 3, wherein the sinking current source, sourcing current source, and first and second active feedback control circuits are powered by a first voltage source, and the switching section is powered by a second voltage source having a lower voltage than the first voltage source.

10. A phase locked loop circuit, comprising:

a phase frequency detector receiving as inputs an input frequency and an output frequency, and generating control signals in response to the input frequency and the output frequency;

a charge pump circuit receiving control signals from the phase frequency detector, and having an output node coupled to a low pass filter and to an input of a voltage controlled oscillator; and a frequency divider receiving an input signal from the voltage controlled oscillator and producing said output frequency at its output, wherein the charge pump circuit comprises:

a sinking current source for driving current out of an output node of the charge pump circuit;

a sourcing current source for driving current into the output node;

a switching section for selectively connecting the sinking and sourcing current sources to the output node in response to control signals;

a reference transistor receiving a reference current;

a first active feedback control circuit controlling a current produced by the sinking current source to be approximately equal in magnitude to the reference current; and a second active feedback control circuit controlling a current produced by the sourcing current source to be approximately equal in magnitude to the reference current.

11. The phase locked loop circuit claimed in claim 10, wherein the sinking current source, sourcing current source, and first and second active feedback control circuits are powered by a first voltage source, and the switching section is powered by a second voltage source having a lower voltage than the first voltage source.

12. A phase locked loop circuit, comprising:

a phase frequency detector receiving as inputs an input frequency and an output frequency, and generating control signals in response to the input frequency and the output frequency;

a charge pump circuit receiving control signals from the phase frequency detector, and having an output node coupled to a low pass filter and to an input of a voltage controlled oscillator; and a frequency divider receiving an input signal from the voltage controlled oscillator and producing said output frequency at its output, wherein the charge pump circuit comprises:

a sinking current source comprising a sinking transistor for driving current out of an output node of the charge pump circuit;

a sourcing current source comprising a sourcing transistor for driving current into the output node;

a switching section for selectively connecting the sinking and sourcing current sources to the output node in response to control signals;

a first active feedback control circuit controlling a current produced by the sinking current source comprising a first voltage regulation device for controlling a drain voltage of the sinking transistor; and a second active feedback control circuit controlling a current produced by the sourcing current source comprising a second voltage regulation device for controlling a drain voltage of the sourcing transistor.

13. The phase locked loop circuit claimed in claim 12, wherein the first voltage regulation device comprises:

a voltage regulation transistor coupled in series between the sinking transistor and the switching section; and a differential amplifier, wherein the differential amplifier receives the drain voltage of the sinking transistor at its negative input, and receives a first reference voltage at its positive input, and supplies its output to the gate of the voltage regulation transistor.

14. The phase locked loop circuit claimed in claim 12, wherein the second voltage regulation device comprises:

a voltage regulation transistor coupled in series between the sourcing transistor and the switching section; and a differential amplifier, wherein the differential amplifier receives the drain voltage of the sourcing transistor at its negative input, and receives a second reference voltage at its positive input, and supplies its output to the gate of the voltage regulation transistor.

15. A transceiver circuit for a wireless communication device, the transceiver circuit including a phase locked loop circuit, the phase locked loop circuit comprising:

a phase frequency detector receiving as inputs an input frequency and an output frequency, and generating control signals in response to the input frequency and the output frequency;

a charge pump circuit receiving control signals from the phase frequency detector, and having an output node coupled to a low pass filter and to an input of a voltage controlled oscillator; and a frequency divider receiving an input signal from the voltage controlled oscillator and producing said output frequency at its output, wherein the charge pump circuit comprises:

a sinking current source for driving current out of an output node of the charge pump circuit;

a sourcing current source for driving current into the output node;

a switching section for selectively connecting the sinking and sourcing current sources to the output node in response to control signals;

a reference transistor receiving a reference current;

a first active feedback control circuit controlling a current produced by the sinking current source to be approximately equal in magnitude to the reference current; and a second active feedback control circuit controlling a current produced by the sourcing current source to be approximately equal in magnitude to the reference current.

16. The transceiver circuit claimed in claim 15, wherein the sinking current source, sourcing current source, and first and second active feedback control circuits are powered by a first voltage source, and the switching section is powered by a second voltage source having a lower voltage than the first voltage source.

17. A transceiver circuit for a wireless communication device, the transceiver circuit including a phase locked loop circuit, the phase locked loop circuit comprising:

a phase frequency detector receiving as inputs an input frequency and an output frequency, and generating control signals in response to the input frequency and the output frequency;

a charge pump circuit receiving control signals from the phase frequency detector, and having an output node coupled to a low pass filter and to an input of a voltage controlled oscillator; and a frequency divider receiving an input signal from the voltage controlled oscillator and producing said output frequency at its output.

wherein the charge pump circuit comprises:

a sinking current source comprising a sinking transistor for driving current out of an output node of the charge pump circuit;

a sourcing current source comprising a sourcing transistor for driving current into the output node;

a switching section for selectively connecting the sinking and sourcing current sources to the output node in response to control signals;

a first active feedback control circuit controlling a current produced by the sinking current source comprising a first voltage regulation device for controlling a drain voltage of the sinking transistor; and a second active feedback control circuit controlling a current produced by the sourcing current source comprising a second voltage regulation device for controlling a drain voltage of the sourcing transistor.

18. The transceiver circuit claimed in claim 17, wherein the first voltage regulation device comprises:

a voltage regulation transistor coupled in series between the sinking transistor and the switching section; and a differential amplifier, wherein the differential amplifier receives the drain voltage of the sinking transistor at its negative input, and receives a first reference voltage at its positive input, and supplies its output to the gate of the voltage regulation transistor.

19. The transceiver circuit claimed in claim 17, wherein the second voltage regulation device comprises:

a voltage regulation transistor coupled in series between the sourcing transistor and the switching section; and a differential amplifier, wherein the differential amplifier receives the drain voltage of the sourcing transistor at its negative input, and receives a second reference voltage at its positive input, and supplies its output to the gate of the voltage regulation transistor.

20. A method for operating a charge pump circuit, comprising:

receiving a first reference voltage at an input of a first active feedback control device associated with a sinking transistor of the charge pump circuit;

regulating the drain voltage of the sinking transistor by the first active feedback control device such that the drain voltage is approximately equal to the first reference voltage;

receiving a second reference voltage at an input of a second active feedback control device associated with a sourcing transistor of the charge pump circuit;

regulating the drain voltage of the sourcing transistor by the second active feedback control device such that the drain voltage is approximately equal to the second reference voltage; and selectively coupling the sinking transistor and the sourcing transistor to an output node of the charge pump circuit in response to control signals received by the charge pump circuit.

21. The method claimed in claim 20, wherein regulating the drain voltage of the sinking transistor comprises controlling a gate voltage applied to a voltage regulation transistor coupled in series to the sinking transistor between the sinking transistor and the output node by a differential amplifier receiving the first reference voltage at its positive input and receiving the drain voltage of the sinking transistor at its negative input.

22. The method claimed in claim 20, wherein regulating the drain voltage of the sourcing transistor comprises controlling a gate voltage applied to a voltage regulation transistor coupled in series to the sourcing transistor between the sourcing transistor and the output node by a differential amplifier receiving the second reference voltage at its positive input and receiving the drain voltage of the sourcing transistor at its negative input.

23. A method for operating a charge pump circuit, comprising:

controlling the current of a sinking current source by active feedback control to be approximately equal to a reference current;

controlling the current of a sourcing current source by active feedback control to be approximately equal to the reference current; and selectively coupling the sinking current source and the sourcing current source to an output node of the charge pump circuit in response to control signals received by the charge pump circuit.

* * * * *